(12) United States Patent
Kobrin et al.

(10) Patent No.: US 9,244,356 B1
(45) Date of Patent: Jan. 26, 2016

(54) TRANSPARENT METAL MESH AND METHOD OF MANUFACTURE

(71) Applicant: Rolith, Inc., Pleasanton, CA (US)

(72) Inventors: Boris Kobrin, Pleasanton, CA (US); Ian McMackin, Austin, TX (US)

(73) Assignee: Rolith, Inc., Pleasanton, CA (US)

( * ) Notice: Subject to any disclaimer, the term of this patent is extended or adjusted under 35 U.S.C. 154(b) by 22 days.

(21) Appl. No.: 14/244,803

(22) Filed: Apr. 3, 2014

(51) Int. Cl.
*H05K 1/00* (2006.01)
*G03F 7/26* (2006.01)
*H05K 1/02* (2006.01)

(52) U.S. Cl.
CPC ............... *G03F 7/26* (2013.01); *H05K 1/0296* (2013.01); *H05K 2201/09209* (2013.01); *H05K 2203/0502* (2013.01)

(58) Field of Classification Search
CPC .............. G03F 1/00; G03F 7/00; G03F 7/20; G03F 7/30; G03B 27/42; F24J 2/00; F24J 2/06; F24J 2/40; F24J 2/50
USPC ......... 174/250; 430/5, 316, 322, 323; 216/41; 355/53; 359/485.05, 883
See application file for complete search history.

(56) References Cited

U.S. PATENT DOCUMENTS

| | | | |
|---|---|---|---|
| 6,148,166 A * | 11/2000 | Watanabe | 399/239 |
| 6,162,264 A * | 12/2000 | Miyazaki et al. | 29/623.5 |
| 6,171,876 B1 * | 1/2001 | Yuang et al. | 438/22 |
| 6,207,472 B1 | 3/2001 | Callegari et al. | |
| 7,144,539 B2 | 12/2006 | Olsson | |
| 8,182,982 B2 | 5/2012 | Kobrin | |
| 8,192,920 B2 * | 6/2012 | Kobrin | 430/322 |
| 8,318,386 B2 | 11/2012 | Kobrin | |
| 8,334,217 B2 | 12/2012 | Kobrin | |
| 8,425,789 B2 | 4/2013 | Kobrin | |
| 8,518,633 B2 | 8/2013 | Kobrin et al. | |
| 2003/0059820 A1 * | 3/2003 | Vo-Dinh | 435/6 |
| 2003/0059987 A1 | 3/2003 | Sirringhaus et al. | |

(Continued)

FOREIGN PATENT DOCUMENTS

EP  1727220 A2  11/2006
JP  60050535 A  3/1985

(Continued)

OTHER PUBLICATIONS

International Search Report and Written Opinion for International Application No. PCT/CH2008/000163 dated Sep. 9, 2008.

(Continued)

*Primary Examiner* — Xiaoliang Chen
(74) *Attorney, Agent, or Firm* — Joshua D. Isenberg; JDI Patent

(57) ABSTRACT

Embodiments of the present disclosure include a metal mesh structure and a method of fabrication thereof. The metal mesh structure includes a metal mesh formed on a substrate. The metal mesh is a 2D or 3D pattern of lines. The lines in the first and second set are characterized by a linewidth that is less than 2 microns. Such metal mesh structures are fabricated through rolling mask lithography. This abstract is provided to comply with rules requiring an abstract that will allow a searcher or other reader to quickly ascertain the subject matter of the technical disclosure. It is submitted with the understanding that it will not be used to interpret or limit the scope or meaning of the claims.

20 Claims, 8 Drawing Sheets

(56) References Cited

U.S. PATENT DOCUMENTS

| | | | |
|---|---|---|---|
| 2004/0036993 A1* | 2/2004 | Tin | 359/883 |
| 2005/0224452 A1 | 10/2005 | Spiess et al. | |
| 2006/0014108 A1 | 1/2006 | Ito et al. | |
| 2006/0099333 A1* | 5/2006 | Cheong et al. | 427/162 |
| 2006/0128165 A1 | 6/2006 | Theiss et al. | |
| 2006/0283539 A1 | 12/2006 | Slafer | |
| 2007/0012950 A1 | 1/2007 | Cain et al. | |
| 2007/0138699 A1 | 6/2007 | Wuister et al. | |
| 2007/0200276 A1 | 8/2007 | Mackey et al. | |
| 2008/0199663 A1* | 8/2008 | Burmeister | 428/195.1 |
| 2009/0046362 A1* | 2/2009 | Guo et al. | 359/486 |
| 2009/0130607 A1* | 5/2009 | Slafer | 430/323 |
| 2009/0269705 A1* | 10/2009 | Kobrin | 430/322 |
| 2009/0297989 A1 | 12/2009 | Kobrin | |
| 2009/0305513 A1 | 12/2009 | Kobrin | |
| 2010/0003904 A1* | 1/2010 | Duescher | 451/259 |
| 2010/0035163 A1 | 2/2010 | Kobrin | |
| 2010/0123885 A1* | 5/2010 | Kobrin | 355/53 |
| 2011/0266521 A1* | 11/2011 | Ferrari et al. | 257/14 |
| 2012/0121820 A1* | 5/2012 | Kaplan et al. | 427/552 |
| 2012/0162629 A1* | 6/2012 | Kobrin | 355/89 |
| 2012/0237731 A1* | 9/2012 | Boegli et al. | 428/156 |
| 2012/0243094 A1* | 9/2012 | Boegli | 359/567 |
| 2013/0224636 A1* | 8/2013 | Kobrin | 430/5 |
| 2013/0323651 A1* | 12/2013 | Solak et al. | 430/322 |
| 2014/0202986 A1* | 7/2014 | Renaldo et al. | 216/41 |
| 2015/0064628 A1* | 3/2015 | Guo | 430/316 |

FOREIGN PATENT DOCUMENTS

| | | |
|---|---|---|
| JP | 63226071 A | 9/1988 |
| JP | 2006114817 A | 4/2006 |
| KR | 20110008159 A | 1/2011 |
| WO | 9909603 A | 2/1999 |
| WO | 2007020442 A1 | 2/2007 |
| WO | 2008128365 A1 | 10/2008 |
| WO | 2009094009 A1 | 7/2009 |
| WO | 2010007405 A1 | 1/2010 |
| WO | 2011087896 A2 | 7/2011 |
| WO | 2013158543 A1 | 10/2013 |

OTHER PUBLICATIONS

International Search Report and Written Opinion for International Application No. PCT/US2008/012901 dated Feb. 6, 2009.
International Search Report and Written Opinion for International Application No. PCT/US2013/036582 dated Jul. 18, 2013.

* cited by examiner

US 9,244,356 B1

TRANSPARENT METAL MESH AND METHOD OF MANUFACTURE

FIELD OF THE DISCLOSURE

The present disclosure is related to lithography methods. More specifically, aspects of the present disclosure are related to nanometer-scale metal mesh devices and methods of fabrication thereof.

BACKGROUND

Photolithography fabrication methods have use in a wide variety of technological applications, including micro-scale and nano-scale fabrication of solar cells, LEDs, integrated circuits, MEMs devices, architectural glass, information displays, and more.

Roll-to-roll and roll-to-plate lithography methods typically use cylindrically shaped masks (e.g. molds, stamps, photomasks, etc.) to transfer desired patterns onto rigid or flexible substrates. A desired pattern can be transferred onto a substrate using, for example, imprinting methods (e.g. nanoimprint lithography), the selective transfer of materials (e.g. micro- or nano-contact printing, decal transfer lithography, etc.), or exposure methods (e.g. optical contact lithography, near field lithography, etc.). Some advanced types of such cylindrical masks use soft polymers as patterned layers laminated on a cylinder's outer surface. Unfortunately, lamination of a layer on a cylindrical surface creates a seam line where the edges of the lamination layer meet. This can create an undesirable image feature at the seam when the pattern is repeatably transferred to a substrate by using the cylindrical mask.

In addition to fabricating a mask having a seamless polymer layer, it would be desirable to fabricate polymer layers with smooth surfaces that are thick and uniform for use in subsequent rolling lithography fabrication methods.

It is within this context that the present invention arises.

DETAILED DESCRIPTION

In certain aspects of the present disclosure rolling mask lithography is used to produce metal mesh structures characterized by linewidths less than 2 microns. Such aspects utilize radiation transmitted through a rotating mask to generate a nanopattern in a layer of radiation-sensitive material on a substrate. Although the rotating mask used to generate the nanopattern within the layer of radiation-sensitive material may be of any configuration which is beneficial, and a number of these are described below, a hollow cylinder is particularly advantageous in terms of imaged substrate manufacturability at minimal maintenance costs.

Figure 1A:
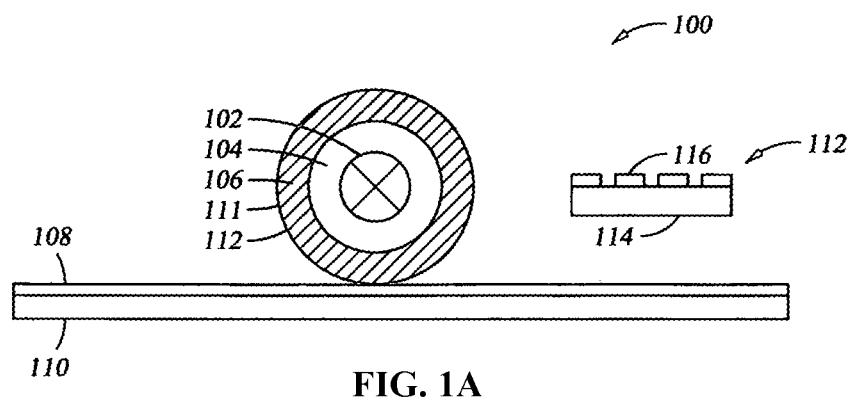
FIG. 1A shows a cross-sectional view of an example of a rolling mask lithograph (RML) apparatus that can be used to pattern of large areas of substrate material.
Figure 1B:
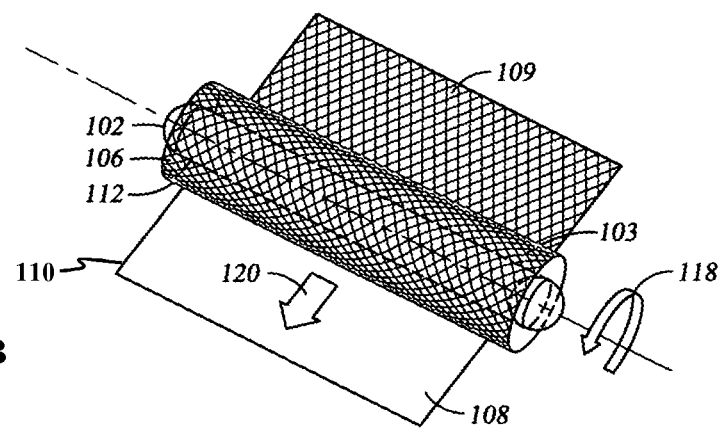
FIG. 1B shows a three-dimensional view of the apparatus and substrate depicted in FIG. 1A.

FIG. 1A and FIG. 1B depict an example of a rolling mask lithograph (RML) apparatus 100 that can be used to pattern of large areas of substrate material. In the apparatus 100, a radiation transparent cylinder 106 has a hollow interior 104 in which a radiation source 102 resides. An exterior surface 111 of the cylinder 106 is patterned with a specific surface relief 112. The cylinder 106 rolls over a radiation sensitive material 108 (e.g., a photoresist) which overlies a substrate 110.

The radiation sensitive material 108 is imaged by radiation passing through surface relief 112. The cylinder 106 rotates in the direction shown by arrow 118, and radiation from a radiation source 102 passes through the nanopattern 112 present on the exterior surface 103 of rotating cylinder 106 to image the radiation-sensitive layer 108 on substrate 110, providing an imaged pattern 109 within the radiation-sensitive layer 108. The radiation-sensitive layer 108 is subsequently developed to provide a nanostructure on the surface of substrate 110. In FIG. 1B, the rotatable cylinder 106 and the substrate 110 are shown to be independently driven relative to each other as shown by arrow 120. In another embodiment, the substrate 110 may be kept in dynamic contact with a rotatable cylinder 106 and moved in a direction toward or away from a contact surface of the rotatable cylinder 106 to provide motion to an otherwise static rotatable cylinder 106. In yet another embodiment, the rotatable cylinder 106 may be rotated on a substrate 110 while the substrate is static.

The specific surface relief 112 may be etched into the exterior surface of the transparent rotating cylinder 106. In the alternative, the specific surface relief 112 may be present on a film of polymeric material which is adhered to the exterior surface of rotating cylinder 106. The film of polymeric material may be produced by deposition of a polymeric material onto a mold (master). The master, created on a silicon substrate, for example, is typically generated using an e-beam direct writing of a pattern into a photoresist present on the silicon substrate. Subsequently the pattern is etched into the silicon substrate. The pattern on the silicon master mold is then replicated into the polymeric material deposited on the surface of the mold. The polymeric material is preferably a conformal material, which exhibits sufficient rigidity to wear well when used as a contact mask against a substrate, but which also can make excellent contact with the radiation-sensitive material on the substrate surface. One example of the conformal materials generally used as a transfer masking material is polydimethylsiloxane (PDMS), which can be cast upon the master mold surface, cured with UV radiation, and peeled from the mold to produce excellent replication of the mold surface.

To produce a metal mesh, the specific surface relief 112 would form a pattern that corresponds to the desired mesh pattern, which may be characterized in terms of a desired pitch and linewidth. In aspects of the present disclosure, it is desirable for the mesh pattern to be characterized by first and second sets of intersecting parallel lines. The lines in the first set are parallel to each other and not parallel to the lines in the second set. Likewise, the lines in the second set are parallel to each other and not parallel to the lines in the first set. The lines in the first and second sets extend continuously across the pattern in a non-staggered fashion. The lines in the two sets are characterized by a linewidth that is less than 2 microns, preferably less than 1 micron, potentially less than 0.5 micron, possibly less than 0.1 micron. The lines in the first set may be regular spaced apart from each other by a first characteristic pitch. Likewise the lines in the second set may be regularly spaced apart from each other by a second characteristic pitch. The first and second pitches may be the same or different. Each characteristic pitch is greater than the linewidth and is up to 10 millimeters. The metal lines in the mesh are also characterized by a thickness, which can be from 50 nm to 10 microns. Although examples are described herein in which the metal mesh has a pattern in the form of regularly intersecting parallel lines, the pattern of the metal mesh may be a 2D or 3D pattern of lines, not necessarily parallel.

Figure 2A:
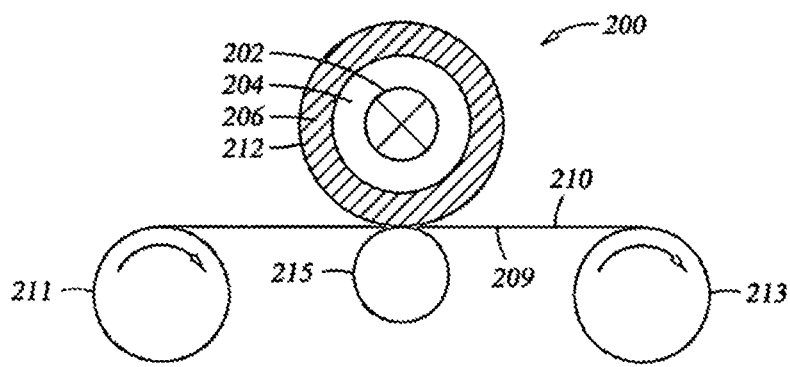
FIG. 2A depicts a cross-sectional view of alternative apparatus useful for patterning of large areas of substrate material.

FIG. 2A shows a cross-sectional view of another example of an apparatus 200 useful in patterning of large areas of substrate material. In FIG. 2A, the substrate is a film 210 upon which a pattern is imaged by radiation which passes through surface relief 212 on a first (transparent) cylinder 206 while film 210 travels from roll 211 to roll 213. A second cylinder 215 is provided on the backside 209 of film 210 to control the contact between the film 210 and the first cylinder 206. The radiation source 202 which is present in the hollow space 204 within transparent cylinder 206 may be a mercury vapor lamp or another radiation source which provides a radiation wavelength of 365 nm or less. The surface relief 212 may be a phase-shift mask, for example, where the mask includes a diffracting surface having a plurality of indentations and protrusions, as discussed above in the Background Art. The protrusions are brought into contact with a surface of a positive photoresist (a radiation-sensitive material), and the surface is exposed to electromagnetic radiation through the phase mask. The phase shift due to radiation passing through indentations as opposed to the protrusions is essentially complete. Minima in intensity of electromagnetic radiation are thereby produced at boundaries between the indentations and protrusions. An elastomeric phase mask conforms well to the surface of the photoresist, and following development of the photoresist, features smaller than 100 nm can be obtained.

Figure 2B:
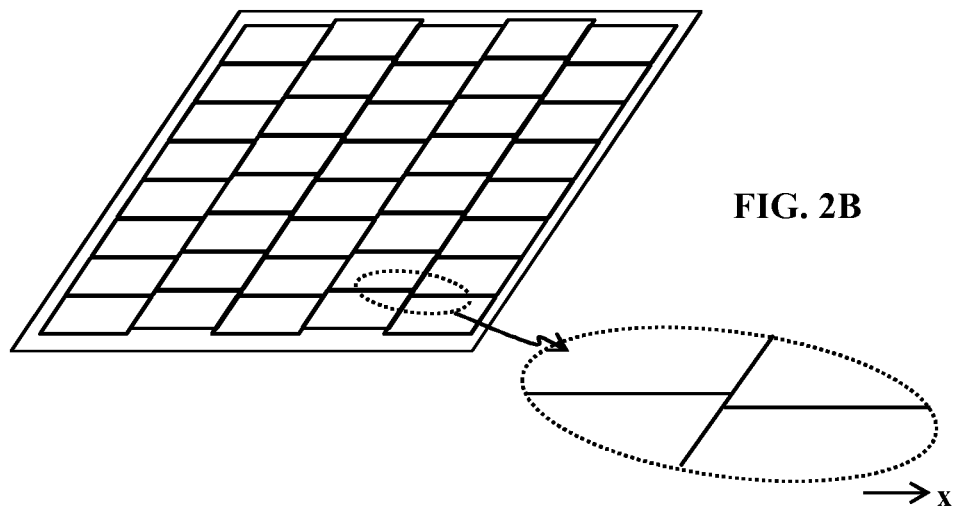
FIG. 2B depicts a three-dimensional view of a metal mesh structure having a staggered pattern.
Figure 2C:
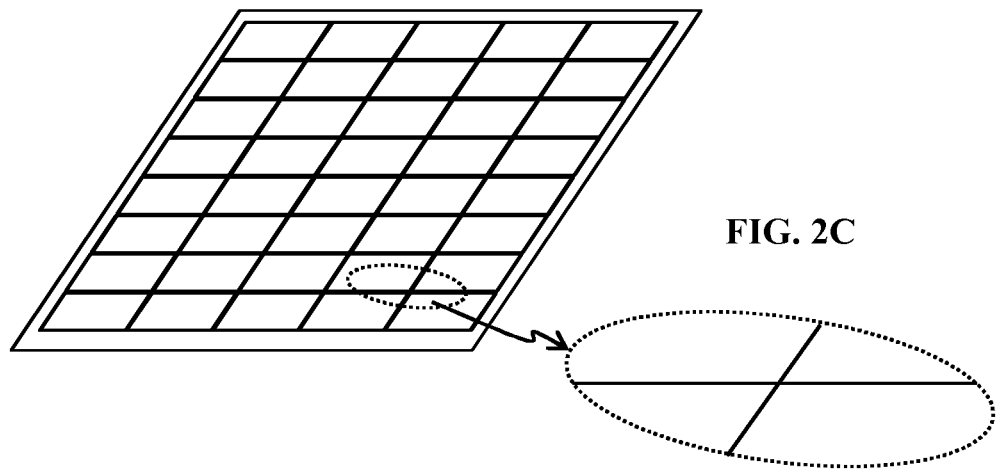
FIG. 2C depicts a three-dimensional view of a metal mesh structure having a continuous non-staggered pattern.

The surface relief 212 would form a desired mesh pattern with a desired pitch and linewidth. As mentioned above, the mesh pattern can be characterized by first and second sets of intersecting parallel lines. The lines in the first set are parallel to each other and not parallel to the lines in the second set. Likewise, the lines in the second set are parallel to each other and not parallel to the lines in the first set. The lines in the first and second sets extend continuously across the pattern in a non-staggered fashion. In comparison, FIG. 2B depicts a three-dimensional view of a metal mesh structure having a staggered pattern. Such patterns are common when using edge lithography to form a mesh pattern. As shown in the enlarged view of FIG. 2B, the lines along the x direction at the intersection do not line up with each other. FIG. 2C, on the other hand, depicts a three-dimensional view of a metal mesh structure having a continuous non-staggered pattern. As shown in the enlarged view of FIG. 2C, the lines along the x direction at the intersection are lined up with each other comparing to FIG. 2B. Such a metal mesh structure can be fabricated using phase lithography.

A key advantage of using RML to fabricate mesh structures is that it allows for fabrication of mesh structures on substrates of unlimited length. The width of continuous mesh structures that can be formed using RML is constrained mainly by the length of the cylinder mask 106. Substrates up to 1 to 2 meters wide and of practically unlimited length, e.g., up to several hundred meters in length or more may be patterned with metal mesh using RML as described in aspects of the present disclosure.

Figure 3A:
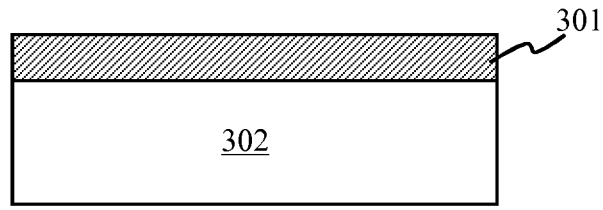
FIGS. 3A-3E illustrate an example of fabrication of metal mesh structures using a metal etch technique.

There are several ways of forming metal mesh structures using RML. For example, as shown in FIGS. 3A-3E, a metal etch technique may be used. In this technique, a metal layer 301 is formed on a substrate 302, as shown in FIG. 3A. The substrate 302 can be, e.g., glass or a polymer material. Deposition of metal materials can be implemented using physical vapor deposition (PVD), sputtering, chemical vapor deposition (CVD), atomic layer deposition (ALD), MVD and other vacuum-based techniques. Non-vacuum methods can also be used, like sol-gel, electroplating, electroless plating, and the like.

Figure 3B:
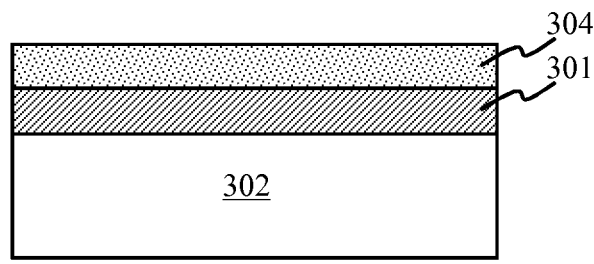

A layer of photo-sensitive material 304 is deposited over the metal layer 301, as shown in FIG. 3B. The photosensitive material 304 could be a photoresist. The photoresist could be a positive resist or a negative resist. A positive resist is a type of photoresist in which the portion of the photoresist that is exposed to light becomes soluble to the photoresist developer. The portion of the photoresist that is unexposed remains insoluble to the photoresist developer. A negative resist is a type of photoresist in which the portion of the photoresist that is exposed to light becomes insoluble to the photoresist developer. The unexposed portion of the photoresist is dissolved by the photoresist developer.

Figure 3C:
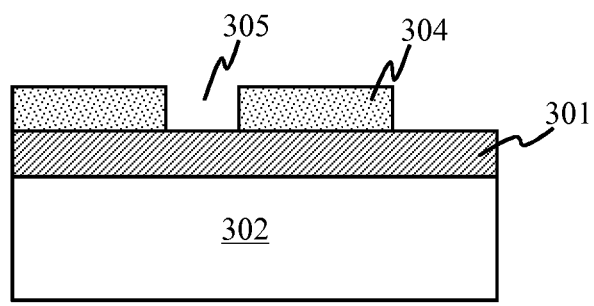
Figure 3D:
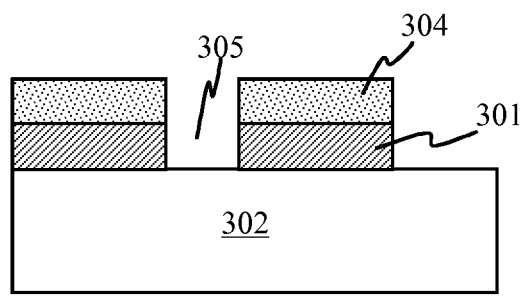
Figure 3E:
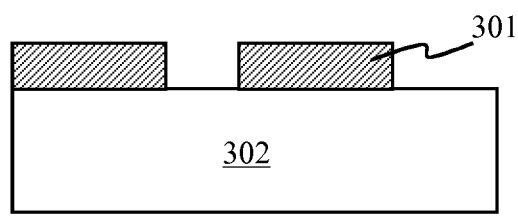

The photosensitive layer 304 can be patterned using RML, e.g., as discussed above, and then developed. The developed photosensitive layer includes a pattern of openings 305 that expose underlying portions of the metal layer 301, as shown in FIG. 3C. The patterned photosensitive material 304 and metal layer 301 can be subjected to an etch process that removes portions of the metal layer exposed by the openings 305 in the resist layer, as shown in FIG. 3D. The etch process can be an anisotropic process, such as a plasma etch process or ion milling. Remaining portions of the photosensitive material 304 can then be removed leaving behind the patterned metal 301 as shown in FIG. 3E.

Figure 4A:
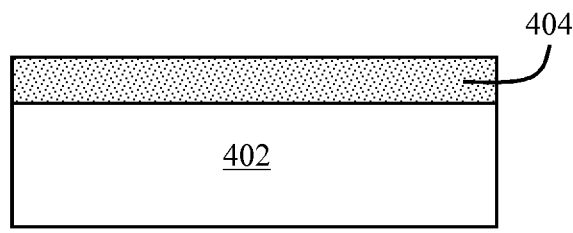
FIGS. 4A-4D illustrate an example of fabrication of metal mesh structures using a "lift-off" technique.
Figure 4B:
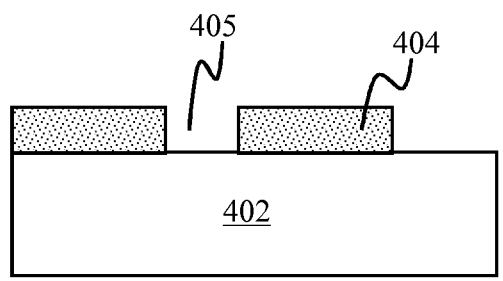

In an alternative implementation, metal mesh structures may be formed by deposition of materials through a template can be followed by lift-off of template materials (photoresists, etc.), e.g., as shown in FIGS. 4A-4D. In this technique, a layer of photosensitive material 404 (e.g., a positive or negative resist) is formed on a substrate 402, as shown in FIG. 4A. The substrate 402 can be, e.g., glass or a polymer material. The photosensitive layer 404 can be patterned using RML, e.g., as discussed above, and then developed. The developed photosensitive layer includes a pattern of openings 405 that expose underlying portions of the substrate 402, as shown in FIG. 4B.

Figure 4C:
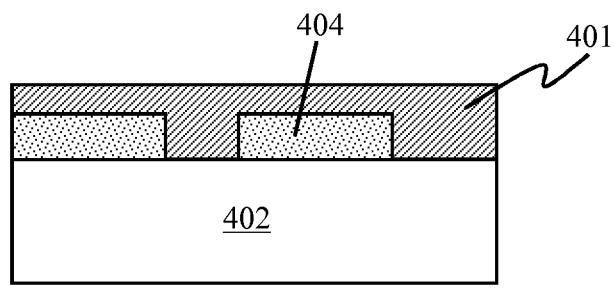

A layer of metal 401 is deposited over the patterned photosensitive material 404 as shown in FIG. 4C. Deposition of the metal layer 401 can be implemented using physical vapor deposition (PVD), sputtering, chemical vapor deposition (CVD), atomic layer deposition (ALD), MVD and other vacuum-based techniques. Non-vacuum methods can also be used, like sol-gel, electroplating, electroless plating, and the like. One preferred metal deposition technique that is useful for forming metal mesh structures is to deposit metal-containing materials from a liquid phase (e.g. as a metal ink) onto the substrate through the patterned photosensitive layer, e.g., using a roller. The metal material may also be sprayed onto the template and substrate. Also, other coating methods for liquid film deposition could be used such as, but not limited to, slot die and gravure coating. An example of such a technique is described, e.g., in U.S. Pat. No. 8,334,217, which is incorporated herein by reference. Metal-containing materials can be chosen to attach only to template materials or only to substrate material exposed through the template. The width and pitch of the metal mesh structures is determined by the corresponding pitch and width in the patterned rolling mask that is used to pattern the photosensitive layer. The thickness of the metal structures can be controlled by optimization of process transfer speed, viscosity of precursor, number of contact cycles with the roller, and other processing parameters.

Figure 4D:
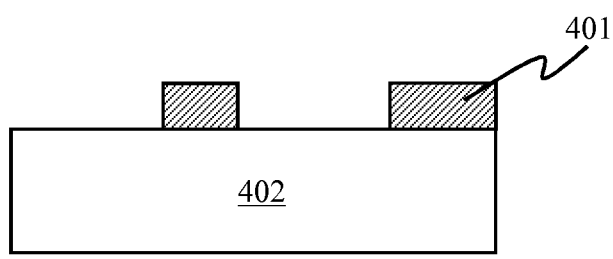

The patterned photosensitive material 404 is then removed in a lift-off process taking with it overlying portions of the metal layer 401. Portions of the metal layer that are in direct contact with the substrate remain behind following the liftoff process, leaving behind a pattern metal layer as shown in FIG. 4D. Some implementations that use a metal-containing ink to form the metal layer 401 include a sintering step to solidify the patterned metal layer. The sintering could take place before lift-off or afterwards.

Using lift-off in conjunction with RML does not require etching the metal layer, e.g., with plasma etch. Plasma etch is a vacuum process that is not compatible with processing of large area flexible substrates. Lift-off also allows for recycling of the metal portions that have been removed in the lift-off process. Lift-off may be advantageously implemented in conjunction with deposition of metal by evaporation, as opposed to sputtering. The evaporation is more anisotropic than sputtering and produces metal lines with smoother sides. Smoother metal lines are particularly advantageous in OLED applications. An OLED (organic light-emitting diode) is a light-emitting diode (LED) in which the emissive electroluminescent layer is a film of organic compound which emits light in response to an electric current. This layer of organic semiconductor is situated between two electrodes. Generally, at least one of these electrodes is transparent. OLEDs are used to create digital displays in devices such as television screens, computer monitors, portable systems such as mobile phones, handheld games consoles and PDAs. A major area of research is the development of white OLED devices for use in solid-state lighting applications. A common problem in manufacture of OLED devices that use metal mesh for one of the electrodes is that the rough metal mesh tends to short through an overlying layer of OLED material to the other electrode. Normally, this is addressed by covering the rough metal lines with a smoothing layer and then depositing the OLED material over the smoothing layer. Using lift-off in conjunction with metal evaporation produce smooth-sided metal mesh structures and the need for a smoothing layer can be avoided.

Figure 5A:
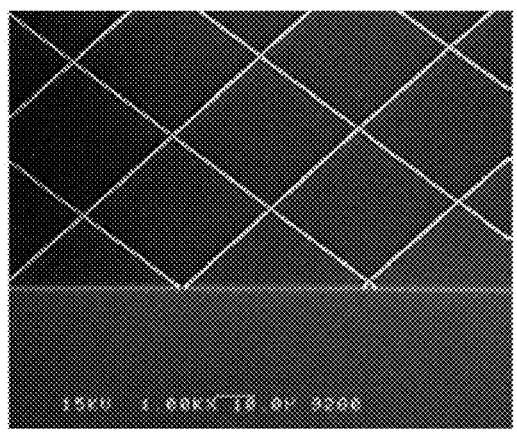
FIGS. 5A-5B are scanning electron micrographs of metal mesh structures fabricated on a glass substrate using a metal etch technique.
Figure 5B:
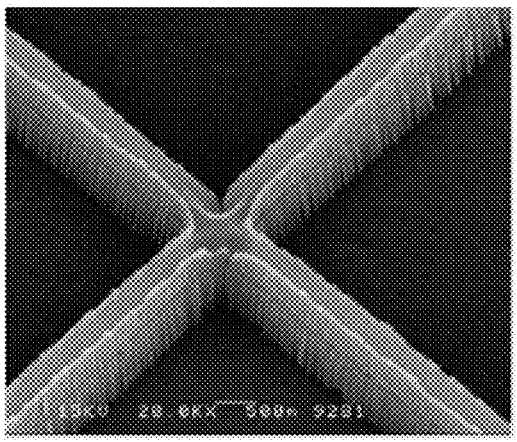
Figure 6A:
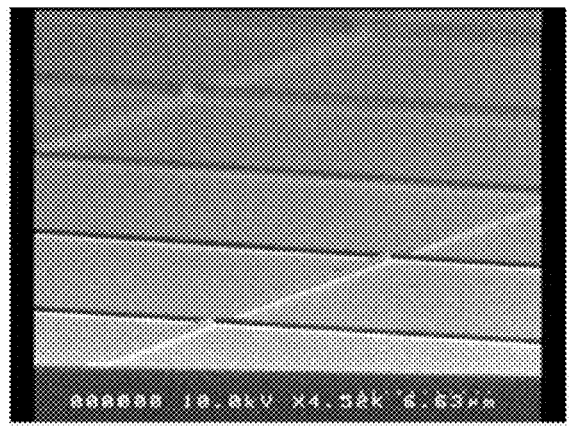
FIGS. 6A-6B are scanning electron micrographs of metal mesh structures fabricated on a glass substrate using a "lift-off" technique.
Figure 6B:
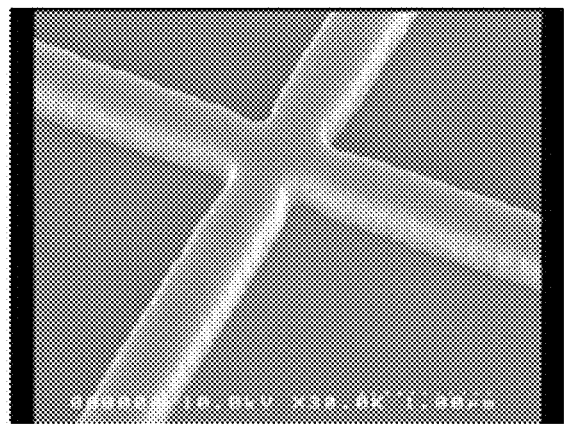
Figure 7A:
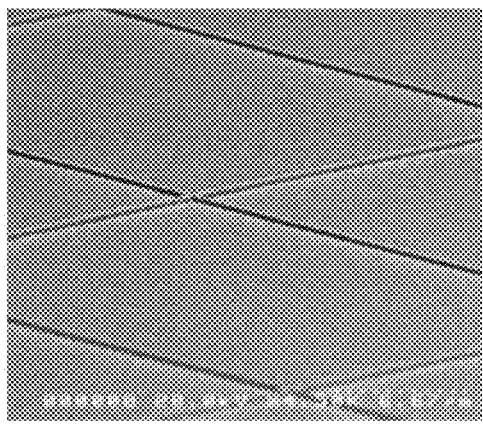
FIGS. 7A-7B are scanning electron micrographs of metal mesh structures fabricated on a polymer substrate using a "lift-off" technique.
Figure 7B:
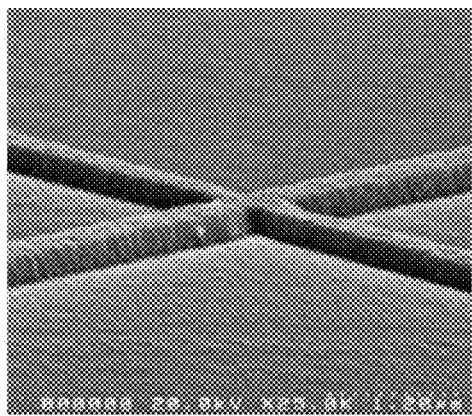

Lift-off in conjunction with metal ink deposition is highly desirable because it removes any vacuum operation from the manufacturing process. Thus metal mesh fabrication can be implemented in a roll-to-roll process, as opposed to a batch process. In addition to being a vacuum process, etching can result in a roughened substrate and/or roughened metal line edges. The difference between etching and lift-off can be clearly seen by comparing FIGS. 5A-5B with FIGS. 6A-6B and 7A-7B. In FIGS. 5A-5B, aluminum mesh structures are formed on a glass substrate using RML and metal etching. Such mesh structures have exhibited 96% transparency and sheet resistance of $3.5\Omega/\square$. In FIGS. 6A-6B, silver mesh structures are formed on a glass substrate using a combination of RML, metal evaporation, and liftoff. Such mesh structures have exhibited 95% transparency and sheet resistance of $3\Omega/\square$. Aspects of the present disclosure allow for manufacture of metal mesh structures on polymer substrates. For example, FIGS. 7A-7B depict silver mesh structures formed on a polymer substrate (polyethylene terephthalate (PET)) using a combination of RML, metal evaporation, and liftoff. Such mesh structures have exhibited 96% transparency and sheet resistance of $5\ \Omega/\square$.

In certain embodiments according to the present disclosure, the photosensitive material is exposed by passing the substrate past the cylinder two or more times. For sufficiently small values of the pitch and linewidth, the linear pattern of exposure resulting from one pass is unlikely to line up with each other. As a result, lines from one pass are likely to end up between lines of a previous pass. By careful choice of the pitch, linewidth, and number of passes it is possible to end up with a pattern of lines in the photosensitive material that has a pitch smaller than the pitch of the lines in the pattern on the cylinder. In addition, each consecutive exposure is done with some misalignment to avoid "Moire" effect".

Figure 8A:
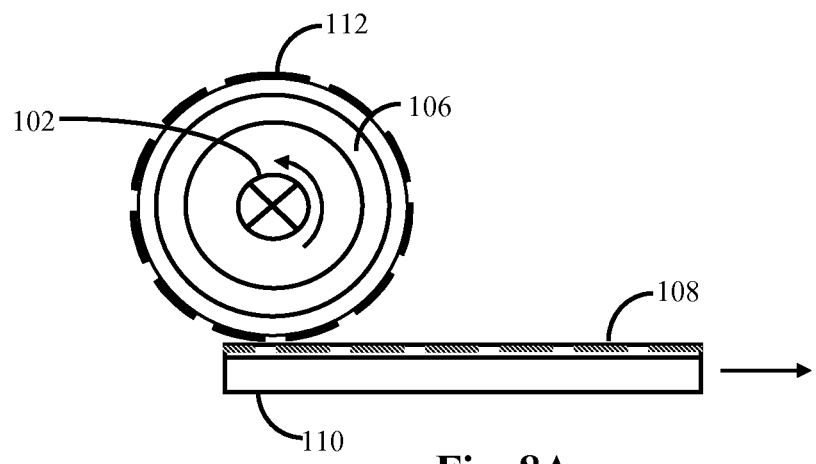
FIGS. 8A-8B are a sequence of schematic diagrams illustrating printing a pattern using rolling mask nanolithography in accordance with an embodiment of the present invention.
Figure 8B:
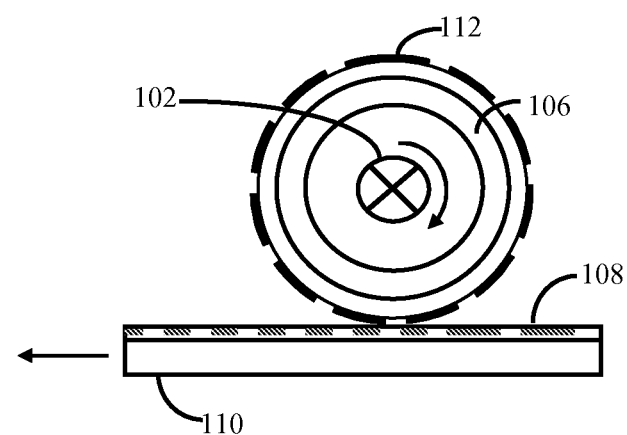

FIGS. 8A-8B are a sequence of schematic diagrams illustrating printing a pattern using rolling mask nanolithography. The substrate 110 translates in a first direction (e.g., to the right in this example) and the cylindrical mask rotates in a corresponding first sense (e.g., counterclockwise in this example) and in a second pass the substrate 110 translates in a second direction (e.g., to the left in this example) opposite the first direction and the cylindrical mask rotates in a second sense opposite the first sense (e.g., clockwise in this example). In the first pass, the lines (or spots) in the pattern 112 are transferred to the photosensitive material as a result of exposure of the photosensitive material to radiation from the source 102 through the pattern 112. In the second pass, previously unexposed portions of the photosensitive material 108 located between neighboring exposed lines or spots are exposed. The linewidth (or spot size) remains more or less the same for both passes, but the resulting pattern in the photosensitive material has a smaller pitch due to the exposure of previously unexposed portions between neighboring exposed portions.

It is noted that the foregoing is only one example and embodiments of the present invention are not limited to the implementation depicted in FIGS. 8A-8B. Alternatively, the substrate 110 may pass the rotating cylindrical mask two times in the same direction (e.g., two times to the right) with the cylinder 106 rotating the same way (e.g., counterclockwise) for each pass.

Other variations are possible. For example, two passes may be accomplished using two rotating cylindrical masks with corresponding light sources, elastomeric films, and patterns. The two rotating cylindrical masks may be arranged in tandem and passing the substrate, e.g., on a conveyor belt such that the substrate passes past one mask and then the other. The two patterns on the masks may have parallel lines characterized by the same pitch and linewidth of the lines in the two patterns or the two patterns may have slightly different pitch and/or linewidth. In another example, a single rotating cylindrical mask may have two different patterns on different portions. The patterns may be characterized by different pitch, linewidth (or spot size), or different shaped spots with the same pitch or different pitches. In a first pass, the photosensitive material may be exposed to the first pattern and in a second pass, the photosensitive material may be exposed to the second pattern. In certain embodiments, the two or more passes may be done at slightly different angles. Specifically, the two or more passes include a first pass of the substrate at an angle relative to an axis of the cylindrical mask and a second pass at a different angle relative to the axis of the cylindrical mask. Alternatively, the second pass may be at a different angle relative to an axis of a different rolling transparent mask. Details of possible variations are described in commonly owned, co-pending PCT Application No. PCT/2012/059388, to Boris Kobrin et al., filed Oct. 9, 2012, and entitled "LITHOGRAPHY WITH REDUCED FEATURE PITCH USING ROTATING MASK TECHNIQUE", the entire contents of which are herein incorporated by reference.

Although the foregoing example describes an embodiment in which periodic patterns of regularly spaced lines are used, embodiments of the invention are not limited to such implementations. Alternatively, non-periodic patterns may be used. Furthermore, embodiments of the present invention are flexible with respect to the feature size in the patterns. For example, it may be desirable to print patterns with different linewidths in different passes. Specifically, wide lines may be printed in a first "roll"/exposure and narrow lines may be printed in a second exposure. Density of the mesh metal pattern/structure can be controlled by number of exposures, misalignment in orthogonal directions, and misalignment by angle.

Aspects of the present disclosure are useful for technological applications, such as touch screen displays, organic light emitting diode (OLED) lighting systems, optical antennae, electromagnetic interference (EMI) shielding, transparent heaters, and electrochromic windows.

Aspects of the present disclosure enable submicron printing, resulting in a two-dimensional mesh made up of 300-800 nm width regular metal lines that are invisible to human eye. This is advantageous since sub-micron line metal mesh structures do not exhibit visible Moiré patterns that would be undesirable, e.g., in display structures.

Metal mesh electrodes produced in accordance with aspects of the disclosure can exhibit sheet resistance R of less than 4Ω/☐ and optical transmission T greater than 96% with low haze factor.

Aspects of the present disclosure allows for formation of metal mesh on large rigid and flexible substrates, up to 2.2 meters in width and of unlimited length.

Aspects of the present disclosure also allow for low cost production technology (e.g., down to $5 per square meter) production technology Unlike silver nanowire (AgNW) technology, aspects of the present disclosure do not compromise haze and transparency with sheet resistance <30Ω/☐. Also, unlike AgNW technology, aspects of the present disclosure can produce transparent metal grid and traces in the same process step/layer Aspects of the present disclosure are believed to provide the only known technology capable of producing sub-micron metal mesh on glass or film on industrial scale.

Those of ordinary skill in the art will readily appreciate that various aspects of the present disclosure may be combined with various other aspects without departing from the scope of the present disclosure.

More generally it is important to note that while the above is a complete description of the preferred embodiments of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "a", or "an" when used in claims containing an open-ended transitional phrase, such as "comprising," refers to a quantity of one or more of the item following the article, except where expressly stated otherwise. Furthermore, the later use of the word "said" or "the" to refer back to the same claim term does not change this meaning, but simply re-invokes that non-singular meaning. The appended claims are not to be interpreted as including means-plus-function limitations or step-plus-function limitations, unless such a limitation is explicitly recited in a given claim using the phrase "means for" or "step for."

What is claimed is:

1. A method of forming a metal mesh, comprising:
    patterning a photo-sensitive material by transmitting radiation through a rolling transparent mask as mask rolls with respect to a substrate carrying the photo-sensitive material;
    developing the photo-sensitive material to produce a mesh pattern in the developed photo-sensitive material;
    patterning a metal layer using the developed photo-sensitive material to produce a corresponding metal mesh pattern in the metal layer, wherein the metal mesh is a 2D or 3D pattern of lines, wherein the lines are characterized by a linewidth that is less than 2 microns.

2. The method of claim 1, wherein the metal layer is disposed between the substrate and the photo-sensitive material and wherein patterning the metal layer using the developed photo-sensitive material includes etching the metal layer through openings in the developed photo-sensitive material.

3. The method of claim 1, wherein the photo-sensitive material is disposed between the substrate and the metal layer and wherein patterning the metal layer using the developed photo-sensitive material includes forming the metal layer over the developed photo-sensitive material and onto portions of the substrate exposed by openings in the developed photo-sensitive material and removing the photo-sensitive material leaving behind metal on the substrate at the portions corresponding to the openings.

4. The method of claim 3, wherein the metal layer is formed by evaporation.

5. The method of claim 3, wherein the metal layer is formed from a liquid layer of metal containing material.

6. The method of claim 5, further comprising sintering the metal containing material before or after removing the photo-sensitive material.

7. The method of claim 1, wherein the metal layer is formed by evaporation.

8. The method of claim 1, the linewidth is less than 1 micron.

9. The method of claim 2 wherein the metal etch is done using plasma etching or ion milling.

10. The method of claim 1, the linewidth is less than 0.5 micron.

11. The method of claim 1, wherein patterning a photo-sensitive material includes rotating the rolling transparent mask in two or more passes of the substrate past the rolling transparent mask to expose the photo-sensitive material to two or more corresponding patterns of features.

12. The method of claim 11, wherein the two or more passes include a first pass with the substrate translating in a first direction and the rolling transparent mask rotating in a corresponding first sense and a second pass with the substrates translating in a second direction opposite the first direction and the rolling transparent mask rotating in a second sense opposite the first sense.

13. The method of claim 11, wherein the two or more passes include a first pass with the substrate translating in a first direction and the rolling transparent mask rotating in a corresponding first sense and a second pass with the substrates translating in the first direction and the rolling transparent mask rotating in the first sense.

14. The method of claim 11, wherein the two or more passes include a first pass past a first rolling transparent mask with the substrate and the first rolling transparent mask rotating in a corresponding sense and a second pass past a second rolling transparent mask with the substrates and the second rolling transparent mask rotating in a corresponding sense.

15. The method of claim 14, wherein the first and second rolling transparent masks are arranged in tandem with the substrate passing both the first and second rolling transparent masks in the same direction with both rolling transparent masks rotating in the same corresponding sense.

16. The method of claim 11, wherein the two or more passes include a first pass of the substrate at a first angle relative to an axis of the rolling transparent mask and a second pass at a second angle relative to the axis of the rolling transparent mask, wherein the first and second angles are different.

17. The method of claim 11, wherein the two or more passes include a first pass of the substrate at a first angle relative to an axis of the rolling transparent mask and a second pass at a second angle relative to an axis of a different rolling transparent mask, wherein the first and second angles are different.

18. The method of claim 11, wherein each pattern of features is characterized by a corresponding pitch and feature size, wherein an offset between the two or more patterns of features results in a combination of the two or more patterns of features that is characterized by a pitch that is less than the pitch for any of the two or more corresponding patterns of features.

19. The method of claim 11, wherein the two or more patterns include features of different feature sizes.

20. The method of claim 19, wherein the two or more passes include a first pass with a first feature pattern and a second pass with a second feature pattern, wherein the second feature pattern is characterized by a smaller feature size than the first feature pattern.

* * * * *